United States Patent [19]
Denney, Jr. et al.

[11] Patent Number: 5,818,692
[45] Date of Patent: Oct. 6, 1998

[54] APPARATUS AND METHOD FOR COOLING AN ELECTRICAL COMPONENT

[75] Inventors: Donald L. Denney, Jr., Wheeling; Martinho R. Pais, Arlington Heights, both of Ill.

[73] Assignee: Motorola, Inc., Schaumburg, Ill.

[21] Appl. No.: 865,811

[22] Filed: May 30, 1997

[51] Int. Cl.⁶ .................................................. H65J 7/20
[52] U.S. Cl. ..................... 361/699; 165/80.3; 165/908; 174/252; 174/254; 361/720; 361/749
[58] Field of Search .............................. 165/80.3, 104.33, 165/908; 174/252, 254; 257/714; 361/698, 699, 701, 719–721, 749

[56] References Cited

U.S. PATENT DOCUMENTS 4,706,164  11/1987  L'Henaff et al. .
5,142,441  8/1992  Seibold et al. ........................ 174/252
5,220,804  6/1993  Tilton et al. .
5,285,351  2/1994  Ikeda .
5,453,911  9/1995  Wolgemuth et al. .

*Primary Examiner*—Gregory D. Thompson
*Attorney, Agent, or Firm*—Heather L. Creps

[57] ABSTRACT

The apparatus includes a flexible printed wiring device (18) having a region sized to receive the electronic component (10) and a channel (28) disposed within the flexible printed wiring device. The channel has an inlet end (32) and an outlet end (34) and has an orifice (36) disposed therein. The inlet end receives a fluid, the fluid is distributed to the orifice via the channel and the orifice directs the fluid toward the region, so that the fluid is in direct contact with the electronic component when the electronic component is disposed in the region.

20 Claims, 2 Drawing Sheets

APPARATUS AND METHOD FOR COOLING AN ELECTRICAL COMPONENT

FIELD OF THE INVENTION

This invention relates generally to cooling heat sources, and, more particularly, to an apparatus and method for cooling an electronic component mounted to a flexible printed wiring device.

BACKGROUND OF THE INVENTION

Electronic components such as integrated circuits, multi-chip modules, passive components and radio frequency (RF) power transistors, which are generally mounted to rigid surfaces such as glass-filled epoxy, alumina, ceramic or plastic circuit boards, may be heat sources which require cooling during normal operation.

Traditionally, electronic components have been cooled by natural or forced air convection, which involves moving large quantities of air past the electronic components, or past heat sinks attached to the components. Advances in electronic devices, however, have resulted in some electronic devices having power densities which exceed the capabilities of traditional natural or forced convective air cooling.

Cold plates, evaporative spray cooling and jet impingement cooling are examples of thermal management techniques which use liquid coolants, rather than air, to dissipate heat generated by electronic components.

The cold plate is typically a direct replacement for an air-cooled heat sink in which water or another fluid flows through internal passages where the heat sink was originally mounted.

It has been proposed to mount heat-producing electronic components to flexible polyimide printed wiring surfaces, and to place the printed wiring surface containing the electronic components directly onto a cold plate.

This technique cools the whole surface of the flexible sheets, however, rather than primary heat sources, such as individual electronic components, located on the surfaces of the sheets. Moreover, the heat transfer capabilities of cold plates may not be adequate for high power electronic devices such as RF transistors, because heat typically must pass through several interfaces before reaching the fluid in the cold plate.

Evaporative spray cooling, or two-phase cooling, features the spraying of atomized fluid droplets directly or indirectly onto a surface of a heat source such as an electronic component. Jet impingement cooling involves directing a high velocity, narrow stream of coolant fluid from an orifice toward the surface of the electronic component to be cooled. When fluid impinges upon the electronic component's surface, the resulting flow field is capable of supporting high heat transfer rates using either single-phase or evaporative cooling.

Although cooling techniques such as spray-cooling and jet impingement cooling are often preferred methods of cooling electronic components mounted to traditional printed circuit boards, the rigid nature of such circuit boards may make them difficult to arrange in three-dimensional space to ensure that cooling fluid reaches high heat-producing components. In addition, material and labor costs may be increased and the space efficiency that is often a benefit of liquid-cooling may not be realized.

There is therefore a need for an apparatus and method for cooling an electronic component mounted to a flexible wiring surface using spray-cooling or jet impingement cooling, which apparatus or method is integrated into the flexible wiring surface, is space-efficient and is simple to manufacture.

SUMMARY OF THE INVENTION

According to an aspect of the present invention, the foregoing needs are addressed by an apparatus for cooling an electronic component which includes a flexible printed wiring device having a region sized to receive the electronic component and a channel disposed within the flexible printed wiring device. The channel has an inlet end and an outlet end and has an orifice disposed therein. The inlet end receives a fluid, the fluid is distributed to the orifice via the channel and the orifice directs the fluid toward the region, so that the fluid is in direct contact with the electronic component when the electronic component is disposed in the region.

According to another aspect of the present invention, an apparatus for cooling an electronic component includes a flexible printed wiring device having a first side and a second side. The first side has a first region and a second region. The first region is sized to receive the electronic component and the flexible printed wiring device positioned so that at least a portion of the first region faces at least a portion of the second region. A fluid distributing channel is disposed within the flexible printed wiring device. A nozzle is in communication with the fluid distributing channel and the second region. The fluid distributing channel receives a fluid and supplies the fluid to the nozzle. The nozzle atomizes the fluid and discharges the fluid toward the electronic component when the electronic component is disposed on the first side.

According to still another aspect of the present invention, an apparatus for cooling an electronic component includes a flexible printed wiring device having a first side and a second side. The first side is sized to receive the electronic component and the flexible printed wiring device is positioned so that at least a portion of the first side faces at least a portion of the second side. A fluid distributing channel is disposed within the flexible printed wiring device and a nozzle is in communication with the fluid distributing channel and the second side. The fluid distributing channel receives a fluid and supplies the fluid to the nozzle. The nozzle atomizes the fluid and discharges the fluid toward the electronic component when the electronic component is disposed on the first side.

According to a further aspect of the present invention, a method for cooling an electronic component includes providing a flexible printed wiring device having a region sized to receive the electronic component and a channel disposed within the flexible printed wiring device; disposing an orifice in the channel; the channel receiving a fluid and distributing the fluid to the orifice; and the orifice directing the fluid toward the region, so that the fluid is in direct contact with the electronic component when the electronic component is disposed in the region.

Advantages of the present invention will become readily apparent to those skilled in the art from the following description of the preferred embodiment(s) of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

DETAILED DESCRIPTION OF THE PREFERRED EMBODIMENTS

Figure 1:
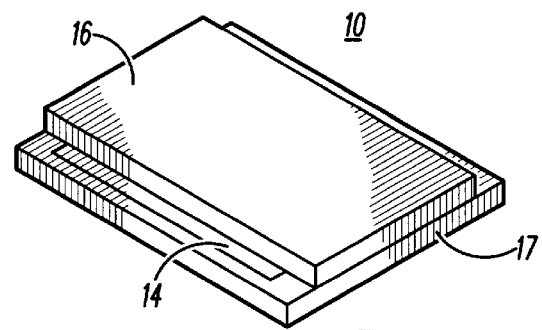
FIG. 1 is a perspective view of a typical prior art electronic component.

Turning now to the drawings, wherein like numerals designate like components, FIG. 1 is a perspective view of a typical electronic component 10. Component 10 includes a number of terminals 14, a base 17, a cover 16 and one or more dies (not shown), which are protected by cover 16.

Electronic component 10 may be, for example, an NPN Silicon Radio Frequency (RF) Power Transistor, such as a flangeless RF power transistor, available from Motorola, order number SRF701. References to electronic component 10 will be understood to apply not only to component 10 as depicted in FIG. 1, but also to differently-configured power transistors and to completely different components, including but not limited to passive components, all types of integrated circuits, multi-chip modules and hybrid circuits.

Figure 2:
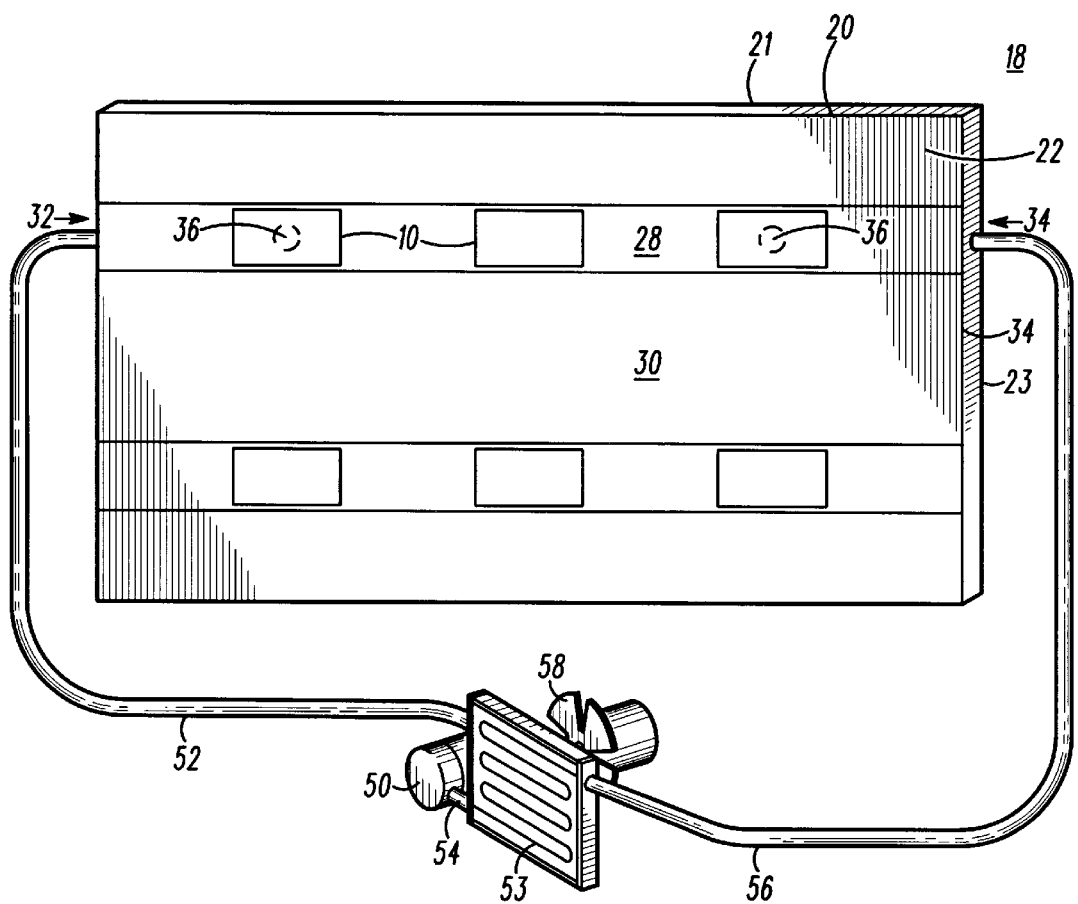
FIG. 2 is a perspective view of an apparatus for cooling the electronic component shown in FIG. 1 according to one aspect of the present invention and an illustration of the operation of the apparatus in conjunction with a cooling system having a closed-loop fluid flow.

As shown in FIG. 2, according to one embodiment of the present invention, the electronic component shown in FIG. 1 is mounted to a flexible printed wiring device 18, such as a Kapton™ flexible sheet available from DuPont. Other suitable flexible materials include Nomex™ and Mylar™ materials, available from DuPont, silicone rubber and Teflon.

Flexible printed wiring device 18 preferably includes two layers 20 and 21 of a polyimide material such as Kapton™ flexible sheets. Alternatively, a single layer of polyimide material may be used. Device 18 may be referred to as having a first side 22 and a second side 23.

Layer 20 may have electronic components 10 and other circuitry manufactured thereon according to well-known methods. For example, electrical wiring (not shown) may be etched into layer 20 and electronic components 10 may be physically and electrically connected to regions along the electrical wiring which are sized to receive the components 10.

One or more fluid distributing channels 28 may be disposed within device 18, between first and second layers 20 and 21, for example. One method of forming channel 28 within flexible printed wiring device 18 is to apply an adhesive (not shown) to particular areas 30 between layers 20 and 21 and not to apply the adhesive to other areas. Then, channel 28 will be formed in areas without adhesive. Fluid distributing channel 28 will generally have an inlet end 32 and an outlet end 34 associated therewith, although multiple channels 28 may share the same inlet and outlet ends. Likewise, one channel 28 may have multiple inlet and outlet ends. Although layers 20 and 21 are preferably permanently secured via adhesive, they may be attached using various other methods.

One or more orifices 36 are disposed within fluid distributing channel 28, preferably under electronic components 10. Orifices 36 may be holes formed to accelerate a fluid toward electronic components 10 or may be nozzles, or receptacles therefor, suitable for atomizing a fluid and spraying the atomized fluid onto components 10. Orifices 36 may be any geometrical shape, including round or rectangular or another suitable shape.

Where nozzles are employed, they are preferably miniature atomizers such as simplex pressure-swirl atomizers, which may be made of any suitable material. An example of a suitable material is a metal such as stainless steel or brass. Simplex pressure-swirl atomizers are described in detail in U.S. Pat. No. 5,220,804 to Tilton et al., incorporated herein by reference, and are commercially available from Isothermal Systems Research, Inc.

FIG. 2 further depicts operation of a closed-loop system for cooling electronic components 10, according to a preferred embodiment of the present invention. A fluid pump 50, which is connected via tube 52 to fluid inlet end 32, supplies a coolant fluid (not shown), which may be any coolant such as water, antifreeze or a dielectric coolant, to fluid distributing channel 28. Tube 52 may be coupled to fluid inlet end 32 using a barbed fitting (not shown), for example, or by any other suitable means.

Fluid passes into channel 28 and through orifice 36, which accelerates the fluid and causes it to impinge on components 10. The fluid may impinge directly onto the underside of electronic component 10, or onto the topside of component 10, according to the orientation in which component 10 is mounted to flexible printed wiring device 18. Additional heat transfer benefits may be realized merely from the flow of fluid through channels 28 in the proximity of components 10. In addition, if additional fluid distributing channels 28 are located in the proximity of components 10, they may enhance heat transfer from components 10.

Orifice 36 is preferably configured such that the impingement point of the fluid is approximately aligned with the largest heat generating region or regions of component 10. The fluid may be discharged from orifice 36 at an angle to first side 22 of device 18, preferably at a perpendicular angle to first side 22, and may component 10, or may impact another thin member (not shown) disposed between component 10 and orifice 36.

Heated fluid may continue on through distributing channel 28 before exiting device 18 through fluid outlet end 34. A portion of the fluid may remain outside of channel 28 and may be collected by any suitable means.

A heat exchanger 53, connected to pump 50 by tube 54 and to fluid outlet end 34 by tube 56, receives fluid from fluid outlet end 34. Heat exchanger 53 rejects heat from the fluid, returning it to primarily a liquid phase. Fan 58 may be used to extend the cooling capacity of heat exchanger 53. Cooled fluid is supplied from heat exchanger 53 to pump 50. Thus, a closed-loop flow of coolant is formed. It will be appreciated that at any given point the coolant may be a vapor, a liquid or a vapor and liquid mixture.

It is contemplated that any conventional means for providing flow of a coolant may be used in conjunction with the described embodiments of the present invention, and that more than one apparatus may be connected to a single source of coolant or that one or more sources of coolant may be connected to a single apparatus, for example, for redundancy purposes. It is also contemplated that an open-loop fluid flow may be used with the various aspects of the present invention.

Sizes of fluid pump 50, heat exchanger 53 and fan 58 should be selected based on heat removal and flow rate requirements. For example, a typical closed-loop fluid flow is 500 to 1000 milliliters per minute for 500 to 1000 Watts of heat dissipation. Pump and heat exchanger assemblies in various sizes, as well as acceptable tubing and fittings, are available from Cole-Parmer in Vernon Hills, Ill., as well as other common sources.

The removal of heat directly from individual electronic components, rather than from an entire electronic module, helps to reduce operating temperatures of the components, increasing reliability through reduction of thermal variation and associated thermal stresses. In addition, efficient heat transfer at low flow rates may be realized.

Figure 3:
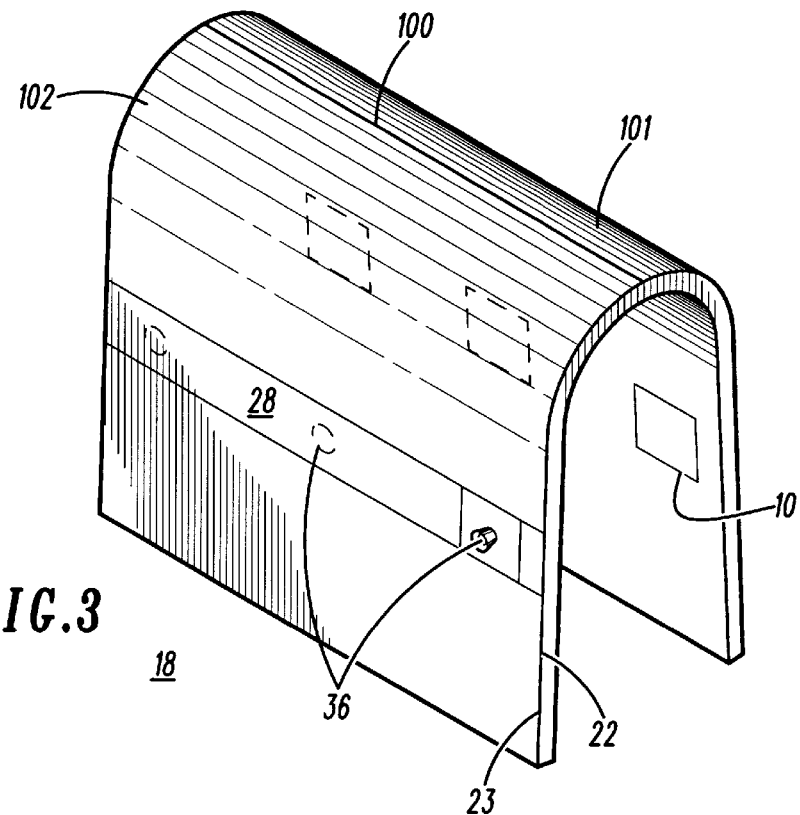
FIG. 3 is a perspective view of an apparatus for cooling the electronic component shown in FIG. 1 according to another aspect of the present invention.

The disclosed apparatus and method may also be made to be space-efficient, as shown in FIG. 3, which is a perspective view of an apparatus for cooling electronic components 10 according to another aspect of the present invention. As shown, flexible printed wiring device 18 has been folded along line 100, so that a first region 101 and a second region 102 are formed on first side 22 and second side 23 of device 18. Components 10 are disposed in first region 101 while fluid distributing channel 28 and orifices 36, which may be nozzles, are located in second region 102. Fluid distributing channel 28 and nozzles may be placed in any suitable location, however. In this manner, fluid may pass into channel 28 and through nozzles 36, which atomize the fluid and cause it to impinge directly on components 10. Nozzles 36 are preferably located from one to ten millimeters from components 10, although a distance of six millimeters may be suitable.

Figure 4:
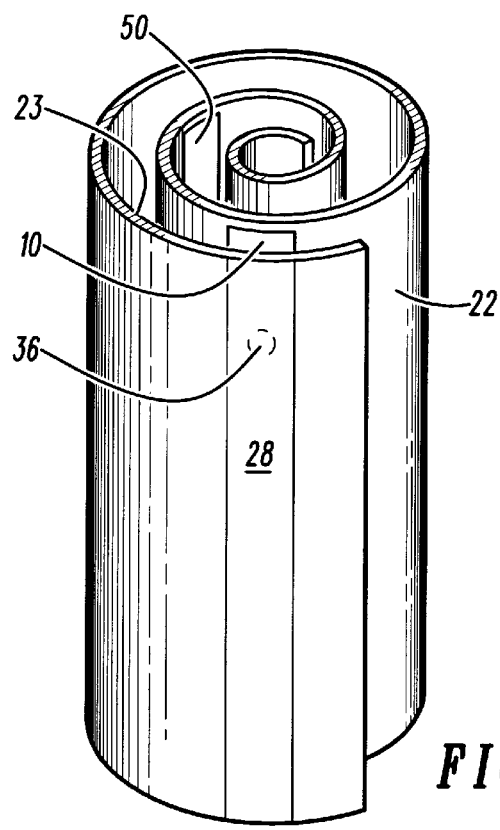
FIG. 4 is a perspective view of an apparatus for cooling the electronic component shown in FIG. 1 according to still another aspect of the present invention.

In accordance with still another aspect of the present invention, a different space-efficient configuration of flexible device 18 is shown in FIG. 4. Electronic component 10 is disposed on first side 22 of device 18, while orifice 36, which may be a nozzle, has its opening on second side 23. Fluid distributing manifold 28, in which orifice 36 is situated, is disposed within flexible device 18. Flexible device 18 is rolled into a cylindrical or spiral shape, so that a portion of first side 22 faces a portion of second side 23, so that nozzle 36 discharges a fluid toward the electronic component. Nozzles 36 are preferably located from one to ten millimeters from components 10, although a distance of six millimeters may be used. It may further be desirable to locate pump 50 in the center of cylindrically-positioned device 18.

Thus, it can be seen that the various aspects of the present invention described herein which utilize flexible circuitry are easily manufactured and are space-efficient. And combining fluid cooling with electronics may reduce cost and complexity often associated with fluid delivery systems.

It is contemplated that wherever sealing and/or fastening may be required, numerous methods and materials may be used. For example, fasteners such as screws, compliant gaskets, ultrasonic welding, brazing, soldering or swaging may be utilized. And it will be understood that any combination of the aspects of the present invention may be used together on a single flexible device. In addition, it may be desirable to create a miniature "cold-plate" using a flexible substrate, having fluid distributing channels embedded therein.

It will be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

We claim:

1. An apparatus for cooling an electronic component, the apparatus comprising:

a flexible printed wiring device having a region sized to receive the electronic component; and a channel disposed within the flexible printed wiring device, the channel having an inlet end and an outlet end and having an orifice disposed therein, the inlet end receiving a fluid, the fluid distributed to the orifice via the channel, the orifice directing the fluid toward the region, so that the fluid is in direct contact with the electronic component when the electronic component is disposed in the region.

2. The apparatus according to claim 1, wherein the fluid is a dielectric fluid.

3. The apparatus according to claim 1, wherein the flexible printed wiring device comprises a first layer and a second layer.

4. The apparatus according to claim 3, wherein the first layer and the second layer are coupled via an adhesive.

5. The apparatus according to claim 4, wherein the channel is formed between the first layer and the second layer in an area where the adhesive is not present.

6. The apparatus according to claim 1, wherein the orifice comprises a nozzle.

7. The apparatus according to claim 6, wherein the nozzle atomizes the fluid.

8. The apparatus according to claim 7, wherein the fluid directed toward the region is in one of a single-phase or a two-phase.

9. The apparatus according to claim 1, wherein the electronic component is one of a power transistor and an integrated circuit.

10. The apparatus according to claim 1, wherein the flexible printed wiring device comprises a polyimide substrate.

11. The apparatus according to claim 1, wherein the polyimide substrate comprises Kapton™ brand polyimide substrate.

12. The apparatus according to claim 1, wherein the flexible printed wiring device is positioned in a spiral shape.

13. The apparatus according to claim 1, further comprising:

a heat exchanger coupled to the outlet end; and a fluid pump coupled to the inlet end for supplying the fluid to the inlet end, the heat exchanger receiving the fluid from the outlet end and supplying the fluid to the fluid pump, forming closed-loop fluid flow.

14. An apparatus for cooling an electronic component, the apparatus comprising:

a flexible printed wiring device having a first side and a second side, the first side having a first region and a second region, the first region sized to receive the electronic component, the flexible printed wiring device positioned so that at least a portion of the first region faces at least a portion of the second region;

a fluid distributing channel disposed within the flexible printed wiring device;

a nozzle in communication with the fluid distributing channel and the second region, the fluid distributing channel receiving a fluid and supplying the fluid to the nozzle, the nozzle atomizing the fluid and discharging the fluid toward the electronic component when the electronic component is disposed on the first side.

15. The apparatus according to claim 14, wherein the flexible printed wiring device is positioned into a spiral shape.

16. The apparatus according to claim 15, wherein a fluid pump is disposed in a center of the spiral shape.

17. The apparatus according to claim 14, wherein the first region is positioned from 1–10 millimeters from the second region.

18. An apparatus for cooling an electronic component, the apparatus comprising:

a flexible printed wiring device having a first side and a second side, the first side sized to receive the electronic component, the flexible printed wiring device positioned so that a least a portion of the first side faces at least a portion of the second side;

a fluid distributing channel disposed within the flexible printed wiring device; and a nozzle in communication with the fluid distributing channel and the second side, the fluid distributing channel receiving a fluid and supplying the fluid to the nozzle, the nozzle atomizing the fluid and discharging the fluid toward the electronic component when the electronic component is disposed on the first side.

19. The apparatus according to claim 18, wherein the first side is positioned 1–10 millimeters from the second side.

20. A method for cooling an electronic component, the method comprising the steps of:

providing a flexible printed wiring device having a region sized to receive the electronic component and a channel disposed within the flexible printed wiring device;

disposing an orifice in the channel;

the channel receiving a fluid and distributing the fluid to the orifice; and the orifice directing the fluid toward the region, so that the fluid is in direct contact with the electronic component when the electronic component is disposed in the region.

\* \* \* \* \*